United States Patent
Manzoli et al.

(10) Patent No.: US 7,528,594 B2
(45) Date of Patent: May 5, 2009

(54) DEVICE FOR THE READING OF DIRECT AND/OR ALTERNATING CURRENTS

(75) Inventors: Romano Manzoli, Carugate (IT); Francesco Viaro, Albino (IT)

(73) Assignee: ABB S.p.A., Milan (IT)

( * ) Notice: Subject to any disclaimer, the term of this patent is extended or adjusted under 35 U.S.C. 154(b) by 0 days.

(21) Appl. No.: 11/156,606

(22) Filed: Jun. 21, 2005

(65) Prior Publication Data

US 2005/0280409 A1    Dec. 22, 2005

(30) Foreign Application Priority Data

Jun. 21, 2004    (IT) .......................... BG2004A0026

(51) Int. Cl.
 *G01R 15/18* (2006.01)
(52) U.S. Cl. ................ 324/127; 324/117 R; 324/117 H
(58) Field of Classification Search ................ 324/126, 324/127, 117 R, 117 H, 99 R, 253
See application file for complete search history.

(56) References Cited

U.S. PATENT DOCUMENTS

| | | | | |
|---|---|---|---|---|
| 3,573,616 A | * | 4/1971 | Kahen ..................... | 324/117 H |
| 3,818,337 A | * | 6/1974 | Groenenbroom et al. .... | 324/127 |
| 3,882,387 A | * | 5/1975 | Vikstrom ................. | 324/117 R |
| 4,276,570 A | | 6/1981 | Burson | |
| 4,314,200 A | * | 2/1982 | Marek ..................... | 324/117 R |
| 5,132,608 A | * | 7/1992 | Nishifuji et al. ........... | 324/99 R |
| 5,223,789 A | | 6/1993 | Katsuyama | |
| 5,296,802 A | * | 3/1994 | Beranger et al. ......... | 324/117 R |
| 5,493,211 A | * | 2/1996 | Baker ......................... | 324/130 |
| 5,550,498 A | * | 8/1996 | Kwan et al. ................. | 327/175 |
| 6,366,076 B1 | * | 4/2002 | Karrer et al. ............ | 324/117 R |
| 6,885,183 B2 | * | 4/2005 | Kato ....................... | 324/117 R |
| 6,984,979 B1 | * | 1/2006 | Edel ............................ | 324/253 |

* cited by examiner

*Primary Examiner*—Ha Tran T Nguyen
*Assistant Examiner*—Arleen M Vazquez
(74) *Attorney, Agent, or Firm*—Connolly Bove Lodge & Hutz LLP; Myron Keith Wyche

(57) ABSTRACT

The present invention is related to a device (1) for the detection of direct and/or alternating current to be used in the realization of highly sensitive amperometric measuring instruments or for the detection of differential faults along with automatic switches. The inventive device comprises a magnetic core (5) disposed in such a manner to surround at least one current-carrying conductor (6). A winding (10) surrounds the magnetic core (5) and is electrically connected to an electrical resistance (60). A voltage source (40) generates a drive voltage (Vexcit) which permits the circulation of a pick-up current (Iexcit) in the said winding (10) and in the said core (5). Amplification means (20) are used to detect the voltage (Vsense) at the terminals of the resistance (60) in order to generate a first signal (Vamp1) which is representative of the above defined current (Iexcit). The inventive device (1) also comprises a feedback adjustment circuit block (70) which acquires the first input signal (Vamp1) in order to generate a second signal which inverts the said drive voltage (Vexcit) when the pick-up current (Iexcit) reaches preset values.

9 Claims, 3 Drawing Sheets

DEVICE FOR THE READING OF DIRECT AND/OR ALTERNATING CURRENTS

The present invention concerns a device for the reading of direct and/or alternating currents to be preferably used in the realisation of highly sensitive amperometric measuring devices or for the reading of differential faults (earth leakage) along with automatic switches.

As noted, there are already different types of AC/DC detectors which are based on different functioning principles. One type of detector, for example, is based on the use of Hall effect sensors, while another type uses driven magnetic cores with a carrier frequency in order to exploit the contact of the magnetic characteristics of the core and in particular the hysteresis loop of the materials that it is made of.

An example of this type of detector is indicated in the U.S. Pat. No. 4,276,510. In particular the detector that is described measures a differential fault by driving the core of a transformer by means of a winding which creates a high frequency magnetic field in the non magnetic saturation zone and detects the useful signal for the reading by means of a secondary winding.

In another example which is indicated in the U.S. Pat. No. 5,223,789, the detecting device uses a winding which produces a magnetic field through a high frequency voltage source.

These and other current solutions present inconveniences. In particular the solutions based on the Hall sensors are not very efficient when used in low cost differential systems because, being highly susceptible to external magnetic fields, they require complex shielding systems. Furthermore, these solutions also have problems related to the relatively high consumption and to the poor dynamics of the reading.

Whereas the solutions which are based on magnetic sensors energized in the non saturated zone, have a precision that is strongly influenced by the tolerance of the core and by the numerous analogical type means that make up these devices. The high number of components, the U.S. Pat. No. 4,276,510 solution for example foresees the presence of an additional winding on the core, makes these solutions particularly costly.

Another disadvantage of the solutions that function in the non saturation zone consists in the undesired "magnetic storage" phenomena that manifest themselves after an inrush current in one of the conductors being measured. This magnetic storage, which is cancelled only after a long period of use, can cause malfunctions and false readings.

Another limit of this solution, in the U.S. Pat. No. 5,223,789 for example, is related to the fact that its function is based on the hypothesis that the BH diagram is constant, and it ignores the drifting of the BH diagram of the core material, for example in coincidence with the passage of strong currents in the conductors being read. Furthermore, it functions with constant frequency sources and without feedback that requires the use of specific and costly materials for the core (high permeability materials with symmetric and rectangular hysteresis curves).

Based on this consideration, the main task of the subject-matter of the present invention is that of supplying an AC/DC current detector which can overcome the above mentioned inconveniences.

In the extent of this undertaking, the principle aim of the present invention is that of supplying an AC/DC current detector that guarantees a high precision and a high reading range of the electrical currents.

Another aim of the present invention is that of supplying an AC/DC current detector that is basically immune to external magnetic fields and magnetic storage phenomenon.

Another aim of the present invention is that of supplying a current detector device made with an extremely limited number of components which function with a very low energy consumption.

Another but not least aim of the present invention is that of supplying an automatic system that is both extremely reliable, relatively easy to be produced and at a competitive price.

The AC/DC current detection device of the present invention comprises:
 a magnetic core (5) capable of being positioned around at least one current (I)-carrying conductor (6);
 a winding (10) around the said magnetic core (5) and connected to an electrical resistance (60);
 a voltage source (40) capable of supplying a (Vexcit) drive voltage following which a pick-up current (Iexcit) is generated circulating in the said winding (10) and in the said electrical resistance (60);
 amplification means (20) connected to the input terminals of the said electrical resistance (60) and capable of generating a first output voltage signal (Vamp1) proportional to the voltage (Vsense) generated at the terminals of the said resistance (60);
 a feedback adjustment circuit block (70) connected, from an operative point of view, to the said amplification means (20) and to the said voltage source (40), the said feedback adjustment system (70) detecting the said first input voltage signal (Vamp1) and generating a second output signal capable of inverting the said drive voltage (Vexcit) when the said circulating current (Iexcit) in the said winding (10) and in the said resistance (60) reach the preset value.

The main advantage of the current detection device of the invention is to be emphasised in the presence of a feedback adjustment system which permits to efficiently exploit the natural characteristics of the chosen materials. This makes the device compatible with magnetic cores in very economic materials, distinct from hysteresis cycles that are not perfectly symmetrical.

Other characteristics and advantages of the invention result mainly from the description of the preferred embodiments, but not only, of the AC/DC current detection device according to the invention, illustrated by way of illustration and not restrictive in the accompanying drawings, in which.

Figure 3:
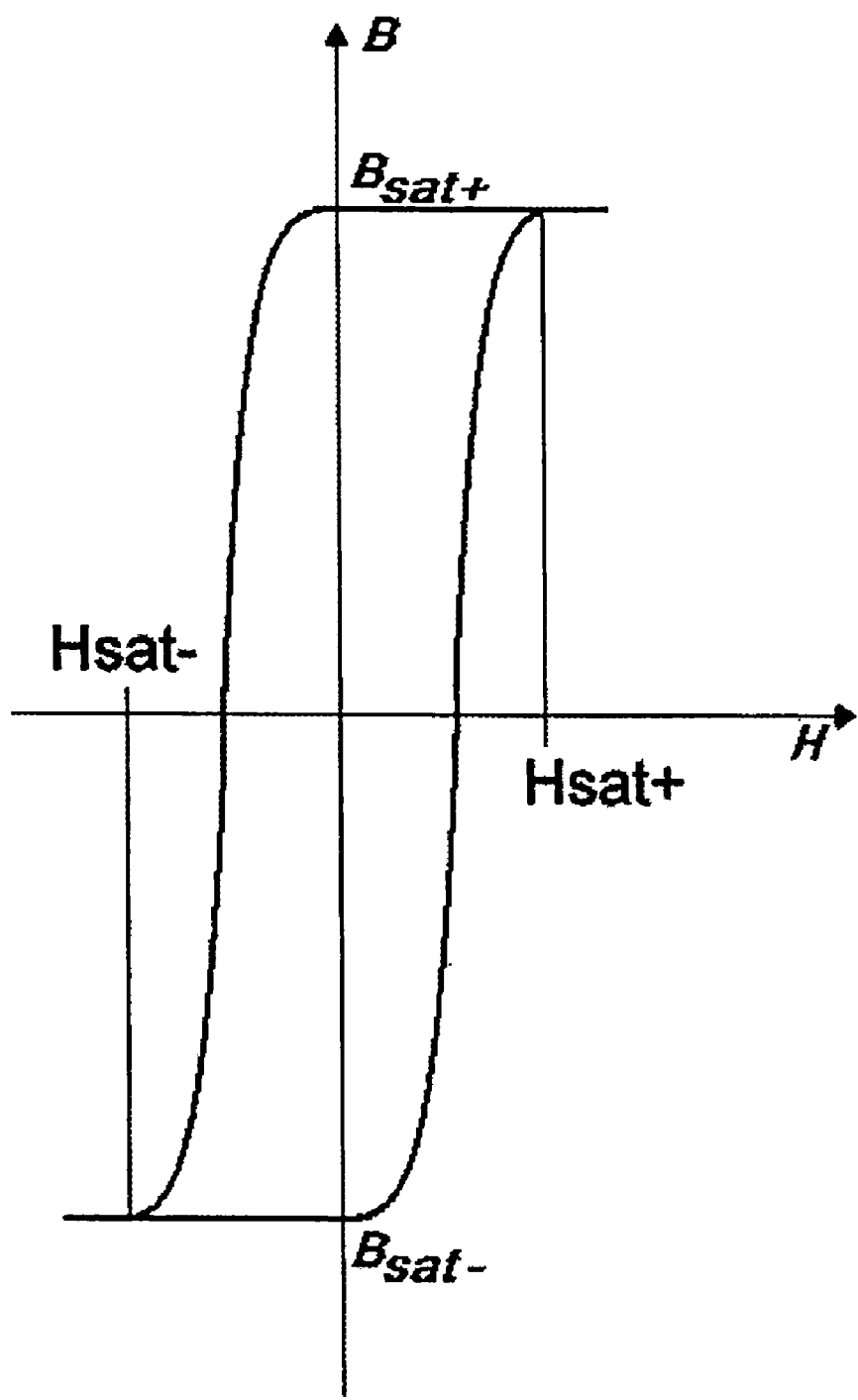

FIG. 3 concerns a hysteresis cycle that is characteristic of a material that constitutes a magnetic core of the inventive detection device.

With reference to the said Figures, the current detection device of the invention includes a magnetic core 5 which encircles one or more conductors 6 through which passes the direct or alternating current. In particular, if the device 1 is used as an ammeter the core 5 is crossed by only one conductor 6, whereas if the device is used as an automatic switch the core is beneficially crossed by different conductors in order to read the amplitude of the vector sum of the currents which are circulating in it. The following description mainly refers to the use of the detection device 1 as an ammeter having the same physical principles in relation to the use as differential.

Figure 1:
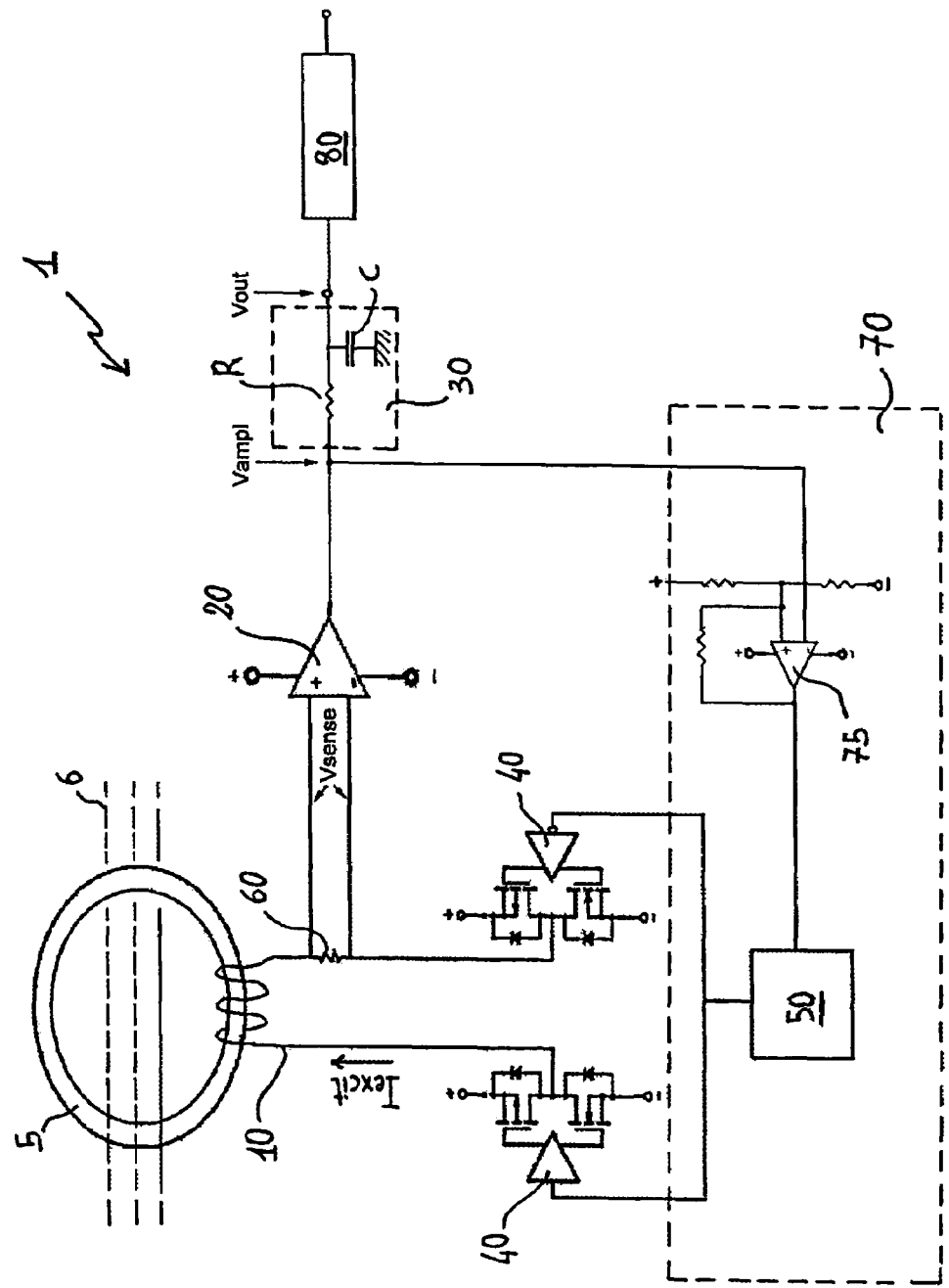
FIG. 1 represents the schematic view of a possible embodiment of the inventive voltage detection device.

With reference to FIG. 1, the device 1 of the invention includes a winding 10, to encircle the core 5, and a resistance 60 which is electrically connected, preferably in series, to the winding 10. A source of voltage 40 supplies a Vexcit drive voltage following which an Iexcit pick-up current is generated to circulate in the said winding 10 and the said resistance 60. Amplification means 20 are connected to the input terminals of the said resistance 60 in order to generate a primary Vamp1 output signal proportional to the Vsense voltage at the terminals of the same resistance 60.

The inventive device 1 is characterised by the fact that it comprises a feedback adjustment circuit block 70 connected to the said amplification means 20 and to the said voltage source 40. In particular, the circuit block 70 receives the first Vamp1 input signal generated by the amplification means 20 and generates a second output signal that is sent to the said voltage source 40 to invert the above mentioned Vexcit drive voltage when the circulating Iexcit current in the said winding 10 and the said resistance 60 reaches the preset value.

These preset values are defined to take the core 5 magnetization cycle into consideration and in such a manner that the saturation condition is safely reached during each inversion cycle.

In a preferred embodiment of the invention, the voltage source 40 includes circuits, such as an H jumper for example, which generate a square wave the amplitude of which is between two preset voltage values Vexcit+ e Vexcit− and the cycle of which is variable and continually controlled by the said second signal generated by the feedback adjustment circuit block 70.

With reference to FIGS. 1 and 3, when current I to be read that is circulating in the defined conductor is zero, applying the Vexcit voltage, a variable Iexcit voltage, that depends on the build characteristics of the components themselves, begins to circulate in the winding 10 and resistance 60. In the core 5, the said Iexcit current produces a variable magnetic field H that, as noted, is connected to the magnetic induction B of the BH graph, shown in FIG. 3, the trend of which is based on the materials that make up the magnetic core 5. In particular, with the increase of the magnetic field H, the magnetic induction B progressively increases to a value known as Bsat+ corresponding to the positive saturation of the magnetic core 5. An analogue and valid logic, suitably changing the signs, when the Vexcit− voltage is applied.

With reference to FIG. 3, in order to efficiently create the saturation phenomenon, materials that have a low saturation value Hsat+ and Hsat− should preferably be used, as well as a pronounced definition of the corresponding induction values Bsat+ e Bsat−. As already mentioned above, once these parameters have been defined they can be used to describe the Iexcit current circulating in the winding 10 and in the resistance 60.

As already mentioned above, on the resistance 60 terminals a Vsense voltage is proportionally established to the Iexcit current circulating in the winding 10 and in the resistance 60. In particular, the said Vsense voltage assumes the maximum value contrary of the Vexcit+ and Vexcit− drive voltages in correspondence to Iexcit+ and Iexcit− pick-up currents having opposing signs. The amplification means 20, connected to the resistance terminals 60, generate a primary Vamp1 signal, proportional to Vsense and immediately useful both for the feedback as well as to be transmitted to the following acquisition stages by means of a low-pass filter 30 for example.

It is obvious that the first Vamp1 signal, which is found at the end of a chain of proportional elements, is itself proportional to the Iexcit pick-up current. In particular, according to the invention, in the magnetic saturation conditions, indicated in FIG. 3 with Bsat+ e Bsat−, values Vamp1+ and Vamp1− correspond that are beneficially used in the feedback adjustment circuit block 70 to invert the Vexcit drive voltage.

Following an embodiment of the invention, the feedback adjustment circuit block 70, includes an amplifier 75 and a drive circuit 50. The said amplifier 75 receives the first Vamp1 input signal activating the drive circuit 50 if conditions require, which generates the said second signal that is responsible for the voltage inversion of the related sources 40.

Figure 2:
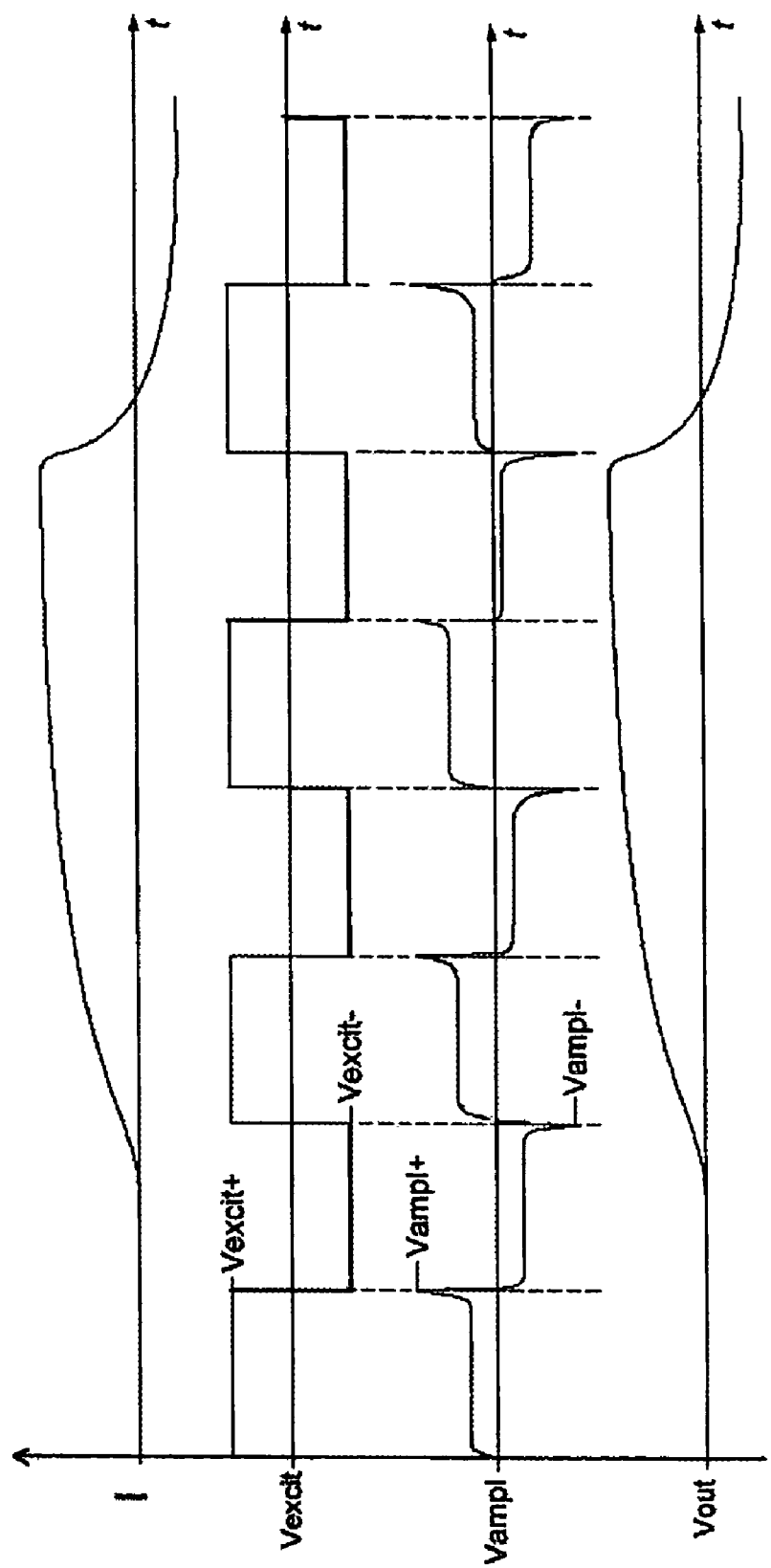
FIG. 2 represents the trend of the characteristic signals of the components of the inventive detection device.

With reference to FIGS. 1 and 2, the low-pass filter 30 has the task of supplying a third Vout signal representative of the currents circulating in the conductor 6. In particular, the filter 30 purifies the first Vamp1 signal from the high frequency components and returns the third Vout analogical signal including the single direct or low frequency component. This can be realised for example through a traditional RC filter that naturally returns a signal that is basically indicative of the entire input signal. Parameters R (resistance) and C (capacity) are suitably calculated based on the functioning range and on the time on which the integration is performed. The said time is calculated taking into consideration the typical frequency range at which the voltage source 40 oscillates, the maximum frequency that is intended to be read in current I and other parameters of device I.

With reference to FIG. 2, in the current I condition with nothing circulating in the conductor 6, there is a substantial symmetry of the above mentioned phenomenon; therefore a zero signal exits from the low-pass filter 30.

If a current I different than zero is circulating in the conductor 6, this will generate a magnetic field in core 5 that will overlap that produced by the Iexcit pick-up current circulating in the winding 10. The said overlap causes an instantaneous variation of the Iexcit current value circulating in the winding 10 and in the resistance 60; the said variation is proportional to the value of current I circulating in the conductor 6. In geometric terms, the Vexcit curve in FIG. 2 that, as said, is proportional to the Iexcit pick-up current, undergoes an upward or downward movement proportional to the value of current I of the conductor 6. The Vamp1 curve assumes the same trend representing the trend of the said first signal. It is therefore seen in this circumstance how the low-pass filter returns a third Vout signal proportional to current I and therefore indicative of the current value itself less than a relative conversion factor.

According to a preferred embodiment of the invention and with the aim of further improving the performance, the device 1 includes an initializer 80 that is positioned down-stream from the low-pass filter 30. By means of a suitable comparison cycles, the initializer 80 advantageously allows to precisely set the variables of device 1 in order to centre the zero of the first Vamp1 output signal of the amplifier with no current I in the conductors 6.

Based on that indicated up until now, the present invention is therefore also relative to a method for the reading of direct and/or alternating current to be used in devices including a magnetic core 5 positioned around at least one current I-carrying conductor 6. In particular, the invention method includes the following phases:

supply a drive voltage (Vexcit) able to generate a pick-up current (Iexcit) circulating within a winding (10) around a magnetic core (5) of the device connected to an electric resistance (60);

read the voltage (Vsense) at the terminals of the said resistance (60) generating a first voltage signal (Vanpl) proportional to the said voltage (Vsense) present at the terminals of the said resistance (60);

generate, based on the said first voltage signal (Vamp1), a second signal capable of inverting the drive voltage (Vexcit) when the current (Iexcit) circulating in the winding (10) and in the resistance (60) reaches preset values.

Therefore with the device and method accomplished in this way the dynamics of the measurement is basically identical to the dynamics of the power supply; in fact the power supply voltage diagram (FIG. 2) does not undergo any cuts, contrary to what foreseen in many of the current state-of-the art solutions. This complete exploitation of the dynamics is automatically translated in a high level dynamics and general precision of the device on a par with other conditions.

It is necessary to notice that the above mentioned feedback adjustment circuit block 70 causes the core 5 to remain in the saturation zone for a very brief time, being advantageous to the energetic consumption that in this way is extremely reduced.

The device and the detection method realised with it, in virtue of the optimisation of the energetic absorption and the very low number of passive components, is characterised by extremely reduced consumptions. This makes it particularly suitable for systems where there is limited available energy.

The current detection device according to the invention is immune to magnetic storage phenomena because on each magnetisation cycle the magnetic field value necessary for the saturation of the core is intentionally exceeded. This alternatively positive and negative magnetic field causes the certain attainment of the positive (Bsat+) and negative (Bsat−) saturation on each magnetisation semi-cycle, which basically causes the automatic reset of the normal functioning conditions, even after an unexpected and undesired saturation of the core caused, for example, by an overcurrent in one of the conductors being measured.

Conceived in this manner, the detection device and method are susceptible to numerous modifications and variants, all within the scope of the invention concept; furthermore, all details can be replaced by other technically equal elements.

Basically, the materials as well as the dimensions can be any depending on the technical requirements and the art.

What is claimed is:

1. Device (1) for the detection of direct and/or alternating current comprising:
    a magnetic core (5) positioned around at least one current (I)-carrying conductor (6);
    a winding (10), which is circled around said magnetic core (5);
    an electrical resistance (60), which is connected in series to said winding;
    a voltage source (40), which is connected to said winding and said electrical resistance, said voltage source supplying a (Vexcit) drive voltage, following which a pick-up current (Jexcit) is generated, said pick-up current circulating in said winding (10) and in said electrical resistance (60);
    amplification means (20), which are connected to the terminals of said electrical resistance (60) and generate a first output voltage signal (Vamp1) proportional to the voltage (Vsense) generated at the terminals of said resistance (60);
    a feedback adjustment circuit block (70), which is directly connected between said amplification means (20) and said voltage source (40), said feedback adjustment block (70) detecting said first output voltage signal (Vamp1) and generating a second output signal that is sent to said voltage source, said voltage source inverting said drive voltage (Vexcit) when said circulating current (Jexcit) in said winding (10) and in said resistance (60) reaches a preset value.

2. Device (I) as in claim 1, wherein the feedback adjustment circuit block (70) generates said second output signal when the value of said pick-up current (Iexcit) is such to guarantee the attainment of the (Bsat+, Bsat−) saturation condition of said magnetic core (5).

3. Device (1) as in claim 1 or 2, wherein said voltage source (40) comprises circuit means, which generate a square wave with a comprised amplitude between two preset voltage values (Vexcit+, Vexcit−) the cycle of which is variable and continually controlled by said second output signal generated by said feedback adjustment circuit block (70).

4. Device (1) as in claims 1, further comprising a low-pass filter (30), which generates a third output voltage signal (Vout) representative of current (I) circulating in said conductor (6), said low-pass filter (30) being connected to the output of said amplification means (20).

5. Device (1) as in claims 4, further comprising an initializer (80) connected to the output of said low-pass filter (30), said initializer (80) precisely setting the variables of the device (1) by means of comparison cycles.

6. Device (1) as in claims 1, wherein said feedback adjustment circuit block (70) comprises an amplifier (75) connected in series to a drive circuit (50), said amplifier (75) detecting said first signal (Vamp1) generated by said amplification means (20), said drive circuit (50) generating said second output signal.

7. A method for the detection of direct and alternating currents in a device, according to claim 1:
    supplying said winding with a drive voltage (Vexcit), which generates a pick-up current (Iexcit) circulating in said winding (10) and in said resistance (60);
    detecting the voltage (Vsense) at the terminals of said resistance (60) and generating a first voltage signal (Vamp 1) proportional to said voltage (Vsense) on the terminals of said resistance (60);
    generating, based on said first voltage signal (Vamp1), a second output signal for inverting said drive voltage (Vexcit) when said current (Iexcit) reaches preset values.

8. The method of claim 7, wherein said drive voltage (Vexcit) is generated as a square wave with a comprised amplitude between two predefined voltage values (Vexcit+, Vexcit−) the cycle of which is variable and continually adjusted through said second output signal.

9. The method as in claim 7, wherein said second signal is generated when the value of said pick-up current (Iexcit) is such to guarantee the attainment of the saturation condition (Bsat+, Bsat−) of the magnetic core (5).

* * * * *